US010656223B2

(12) United States Patent
Hamada et al.

(10) Patent No.: US 10,656,223 B2
(45) Date of Patent: May 19, 2020

(54) MAGNETIC FIELD GENERATION DEVICE

(71) Applicant: JAPAN SUPERCONDUCTOR TECHNOLOGY, INC., Hyogo (JP)

(72) Inventors: Mamoru Hamada, Hyogo (JP); Hideaki Maeda, Saitama (JP); Yoshinori Yanagisawa, Chiba (JP); Hideki Nakagome, Chiba (JP)

(73) Assignee: JAPAN SUPERCONDUCTOR TECHNOLOGY, INC., Hyogo (JP)

( * ) Notice: Subject to any disclaimer, the term of this patent is extended or adjusted under 35 U.S.C. 154(b) by 677 days.

(21) Appl. No.: 14/897,418

(22) PCT Filed: Jun. 10, 2014

(86) PCT No.: PCT/JP2014/065278
§ 371 (c)(1),
(2) Date: Dec. 10, 2015

(87) PCT Pub. No.: WO2014/199962
PCT Pub. Date: Dec. 18, 2014

(65) Prior Publication Data
US 2016/0131726 A1 May 12, 2016

(30) Foreign Application Priority Data

Jun. 12, 2013 (JP) ................................. 2013-123623

(51) Int. Cl.
*G01R 33/3815* (2006.01)
*G01R 33/3875* (2006.01)

(52) U.S. Cl.
CPC ..... *G01R 33/3815* (2013.01); *G01R 33/3875* (2013.01)

(58) Field of Classification Search
CPC ............ G01R 33/3815; G01R 33/3875; G01R 33/389
See application file for complete search history.

(56) References Cited

U.S. PATENT DOCUMENTS

| 5,343,182 A * | 8/1994 | Ohta .................. G01R 33/3875 324/319 |
| 2002/0089328 A1 * | 7/2002 | Goto .................. G01R 33/3875 324/307 |

(Continued)

FOREIGN PATENT DOCUMENTS

| JP | H08-215171 A | 8/1996 |
| JP | H10-262947 A | 10/1998 |

(Continued)

OTHER PUBLICATIONS

The extended European search report issued by the European Patent Office dated Jan. 9, 2017, which corresponds to European Patent Application No. 14810349.2-1568 and is related to U.S. Appl. No. 14/897,418.

(Continued)

*Primary Examiner* — Son T Le
*Assistant Examiner* — Adam S Clarke
(74) *Attorney, Agent, or Firm* — Studebaker & Brackett PC

(57) ABSTRACT

A magnetic field generation apparatus includes a main coil and a variable-current correction coil. The main coil is formed by winding a ReBCO-based superconductive wire rod and generates a magnetic field in a measurement space. The variable-current correction coil is variable in a value of a current, coaxial with the main coil and disposed inside the main coil, and generates a magnetic field which corrects a uniformity of the magnetic field generated by the main coil.

13 Claims, 8 Drawing Sheets

(56) References Cited

U.S. PATENT DOCUMENTS

| | | | |
|---|---|---|---|
| 2003/0011456 A1* | 1/2003 | Yoshida | G01R 33/3873 335/299 |
| 2004/0041567 A1 | 3/2004 | Goto | |
| 2004/0071324 A1* | 4/2004 | Norris | G01R 33/56509 382/128 |
| 2005/0253586 A1* | 11/2005 | Kakugawa | G01R 33/381 324/321 |
| 2007/0241755 A1 | 10/2007 | Ikedo | |
| 2008/0246480 A1* | 10/2008 | Kawamoto | G01R 33/385 324/318 |
| 2009/0212891 A1* | 8/2009 | Hickman | G01R 33/3815 335/216 |
| 2010/0194393 A1* | 8/2010 | Abe | A61B 5/055 324/318 |
| 2015/0198783 A1* | 7/2015 | Shimotsu | G02B 7/08 359/814 |

FOREIGN PATENT DOCUMENTS

| | | |
|---|---|---|
| JP | 3055011 U | 12/1998 |
| JP | 2001-264402 A | 9/2001 |
| JP | 2004-081493 A | 3/2004 |
| JP | 2004-325251 A | 11/2004 |
| JP | 2007-301348 A | 11/2007 |
| JP | 2008-125928 A | 6/2008 |
| JP | 2010-263111 A | 11/2010 |
| JP | 2011-152348 A | 8/2011 |

OTHER PUBLICATIONS

A. Otsuka, et al.; "A 1.3 GHz NMR Magnet Design Under High Hoop Stress Condition"; IEEE Transactions on Applied Superconductivity; vol. 20; No. 3; Jun. 2010; pp. 596-599.

Shinji Matsumoto et al.; "REBCO Layer-Wound Coil Tests Under Electromagnetic Forces in an External Magnetic Field of up to 17.2 T"; IEEE Transactions on Applied Superconductivity; vol. 22; No. 3; Jun. 2012; p9501604.

International Search Report issued in Application No. PCT/JP2014/065278, dated Sep. 9, 2014.

Translation of Written Opinion of the International Searching Authority; PCT/JP2014/065278, dated Sep. 9, 2014.

Hiroto Suematsu, et al.; "Development of Next-generation NMR Technology using HTS Materials"; Cryogenic engineering; Mar. 19, 2013; vol. 48; No. 1; pp. 31-38; with English abstract.

Yoshinori Yanagisawa, et al.; "Mechanism and Suppressive Methods for Screening-current-induced Magnetic Field of REBCO Coils"; Cryogenic engineering; Apr. 25, 2013; vol. 48; No. 4; pp. 165-171; with English abstract.

* cited by examiner

MAGNETIC FIELD GENERATION DEVICE

TECHNICAL FIELD

The present invention relates to a magnetic field generation apparatus applied in an NMR (Nuclear Magnetic Resonance) instrument or an MRI instrument.

BACKGROUND ART

Conventionally, $Nb_3Sn$ superconductive wire rods disclosed in Patent Document 1, NbTi superconductive wire rods, $Nb_3Al$ superconductive wire rods, etc. are used as windings of superconducting coils used in NMR instruments and MRI instruments.

PRIOR ART DOCUMENTS

Patent Documents

Patent Document 1: JP-B-3-55011

SUMMARY OF THE INVENTION

Problems to Be Solved by the Invention

ReBCO-based superconductive wire rods as typified by Y-based ones and Gd-based ones are expected to expand in uses because they have better properties than metallic superconductive wire rods that are currently in industrial use and they enable a flow of superconductive current at temperatures higher than the liquid helium temperature and hence can obtain a strong magnetic field even if not cooled to the liquid helium temperature.

It is known that if a magnetic field is applied to a ReBCO-based superconductive wire rod being in a superconducting state, in the direction perpendicular to the tape surface of the wire rod, a shielding current flows through the superconductive layer to prevent entrance of a magnetic flux into the superconductive layer.

In magnetic field generation apparatus used in NMR instruments or MRI instruments, the uniformity of a magnetic field generated in a measurement space by a main coil is corrected by a magnetic field generated by correction coils disposed outside the main coil. However, where the main coil is formed by winding a ReBCO-based superconductive wire rod, the correction coils generate a magnetic field that is perpendicular to the tape surface of the ReBCO-based superconductive wire rod, thereby a shielding current flows through the superconductive layer and this shielding current decreases the magnetic field generated by the correction coils. As a result, the magnetic field uniformity is lowered.

In view of the above, it is conceivable to design correction coils taking magnetic field weakening due to a shielding current into consideration in advance or to dispose, outside the correction coils, shim coils for generating a magnetic field for correcting particular magnetic field components. However, to compensate for magnetic field weakening, it is necessary to increase the correction coils in size, which causes a problem that the overall size of the apparatus is increased. Disposing separate shim coils also causes a problem that the overall size of the apparatus is increased.

An object of the present invention is to provide a magnetic field generation apparatus capable of increasing the uniformity of a magnetic field and suppressing increase of the overall size of the apparatus.

Solution to Problem

A magnetic field generation apparatus of the present invention includes a main coil which is formed by winding a ReBCO-based superconductive wire rod and generates a magnetic field in a measurement space; and a variable-current correction coil which is variable in a value of a current, coaxial with the main coil and disposed inside the main coil, and generates a magnetic field which corrects an uniformity of the magnetic field generated by the main coil.

Advantages of the Invention

According to the present invention, the variable-current correction coil which generates a magnetic field for correcting the uniformity of a magnetic field generated by the main coil is disposed inside the main coil. Where correction coils or shim coils are disposed outside the main coil, since they generate a magnetic field that is perpendicular to the tape surface of the ReBCO-based superconductive wire rod of the main coil, a shielding current flows through the superconductive layer of the ReBCO-based superconductive wire rod and this shielding current decreases a magnetic field generated by the correction coils or shim coils. As a result, the magnetic field uniformity is lowered. In contrast, a magnetic field generated by the variable-current correction coil which is disposed inside the main coil receives almost no influence from the shielding current flowing through the superconductive layer of the ReBCO-based superconductive wire rod. Therefore, the uniformity of the magnetic field generated by the main coil can be corrected efficiently by the magnetic field generated by the variable-current correction coil and hence the magnetic field uniformity can be increased. Furthermore, disposing the variable-current correction coil inside the main coil can suppress increase of the overall size of the apparatus more than in the case that correction coils or shim coils are disposed outside the main coil.

MODES FOR CARRYING OUT THE INVENTION

Figure 1:
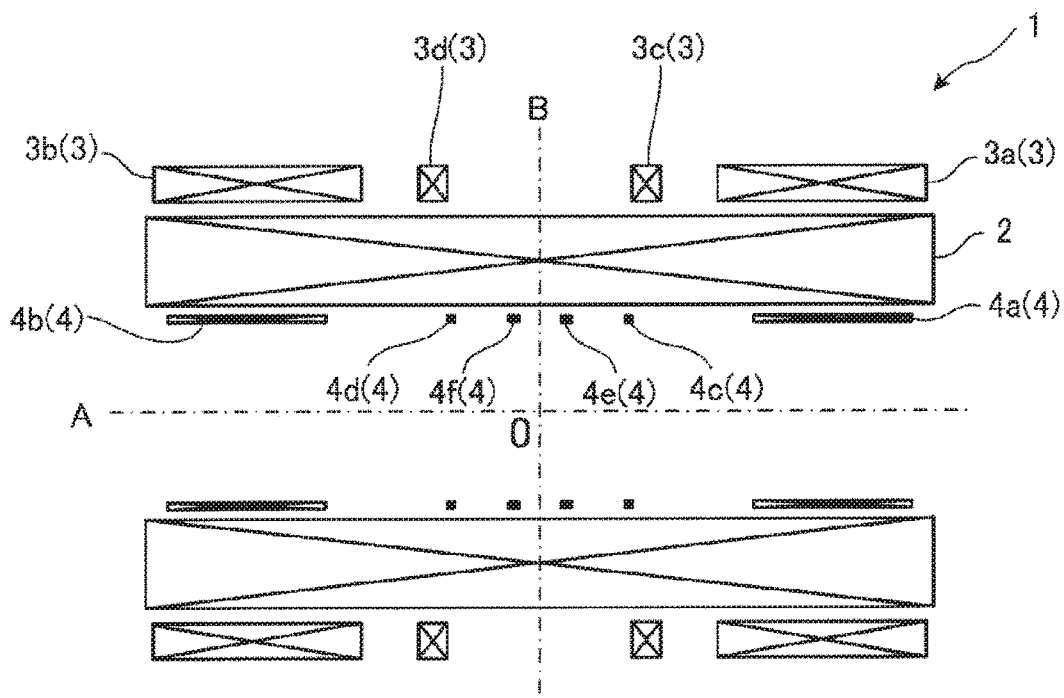
FIG. 1 is a schematic sectional view illustrating a magnetic field generation apparatus.

A preferred embodiment of the present invention will be hereinafter described with reference to the drawings.
(Configuration of Magnetic Field Generation Apparatus)
As illustrated in FIG. 1 which is a schematic sectional view, a magnetic field generation apparatus 1 according to the embodiment is equipped with a main coil 2 which is formed by winding a ReBCO-based superconductive wire rod, plural correction coils 3 which are coaxial with the main coil 2 and disposed outside the main coil 2, and plural variable-current correction coils 4 which are coaxial with the main coil 2 and disposed inside the main coil 2.

(Main Coil)

The main coil 2 is a coil that is formed by winding a ReBCO-based superconductive wire rod around a center axis A. Where the Z-axis direction is defined as the direction extending along the center axis A and the origin is defined as the intersection of the center axis A and an axis B that is perpendicular to the center axis A, the center of the main coil 2 in the Z-axis direction is located at the origin. The main coil 2 generates a magnetic field mainly in a measurement space that is its internal space.

(Structure of ReBCO-Based Superconductive Wire Rod)

Figure 2:
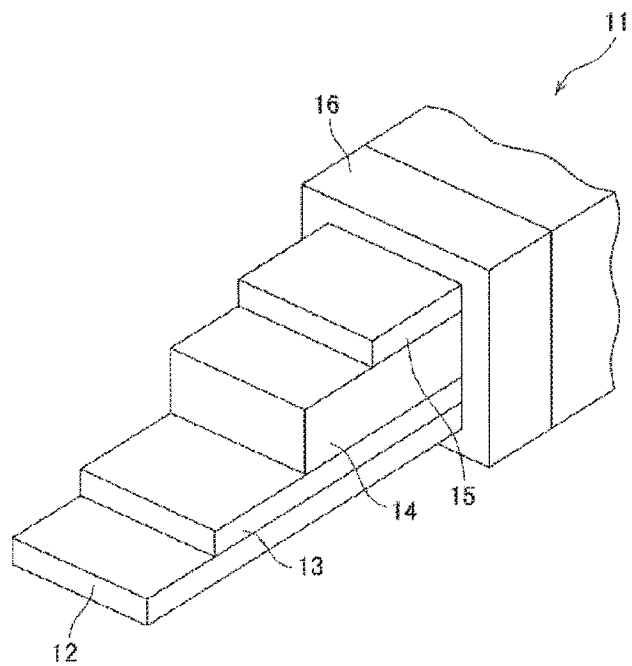
FIG. 2 is a perspective view illustrating the structure of a ReBCO-based superconductive wire rod.

FIG. 2 illustrates a typical structure of a ReBCO-based superconductive wire rod by which the main coil 2 is formed. As illustrated in FIG. 2 which is a perspective view, the ReBCO-based superconductive wire rod 11 is a tape-shaped oxide superconductive wire rod having a structure that a buffer layer 13, a superconductive layer 14 and a stabilization layer 15 are formed in this order on a substrate 12 and they are covered with an electric insulation member 16 in their entirety. Although not shown in any drawings, there may be a case in which stabilization layers are present at the two respective sides of the wire rod or a case in which it surrounds the entire wire rod.

The substrate 12 is made of Hastelloy, an Ni-alloy; or the like, and the buffer layer 13 is made of YSZ, MgO, $CeO_2$, or the like. The superconductive layer 14 is made of ReBCO, YBCO, NdBCO, SmBCO, or the like, and the stabilization layer 15 is made of Ag, Ag—Cu, Cu, or the like. The electric insulation member 16 is an electric insulation tape (polyimide or polyester), for example. The thickness of the substrate 12 is 200 μm or less. The thicknesses of the buffer layer 13, the superconductive layer 14 and the stabilization layer 15 are less than 3 μm, 1 to 10 μm and 1 to 100 μm, respectively. The width of the ReBCO-based superconductive wire rod 11 is about several millimeters (3 mm, 4 mm, 5 mm) to 12 mm.

The ReBCO-based superconductive wire rod 11 is high in the strength of the substrate 12. Therefore, in contrast to $Nb_3Sn$ superconductive wire rods which are typical metallic wire rods used in strong magnetic fields and have yield strength of about 200 MPa, the superconduction properties of the ReBCO-based superconductive wire rod 11 degrade only a little even if a tensile strength of about 1,000 MPa is applied in the longitudinal direction of the wire rod. In designing and manufacturing a superconducting coil, a wire rod size and a current density are set according to an allowable stress of a wire rod. The overall size of a coil can be reduced by utilizing the above characteristic. In other words, a stronger magnetic field can be produced if the coil size is kept the same.

Figure 3:
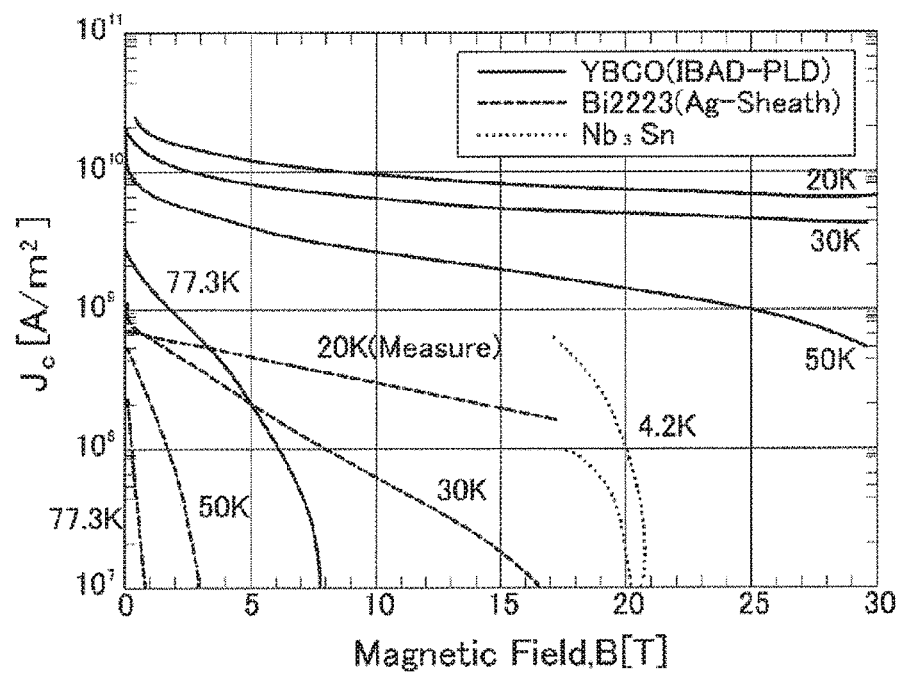
FIG. 3 is a view showing a property of YBCO superconductor.

FIG. 3 shows a property of YBCO which is one kind of the ReBCO-based superconductive wire rod 11. YBCO exhibits better properties than the properties of metallic superconductive wire rods currently in industrial use such as Bi2223 and $Nb_3Sn$.

Figure 4:
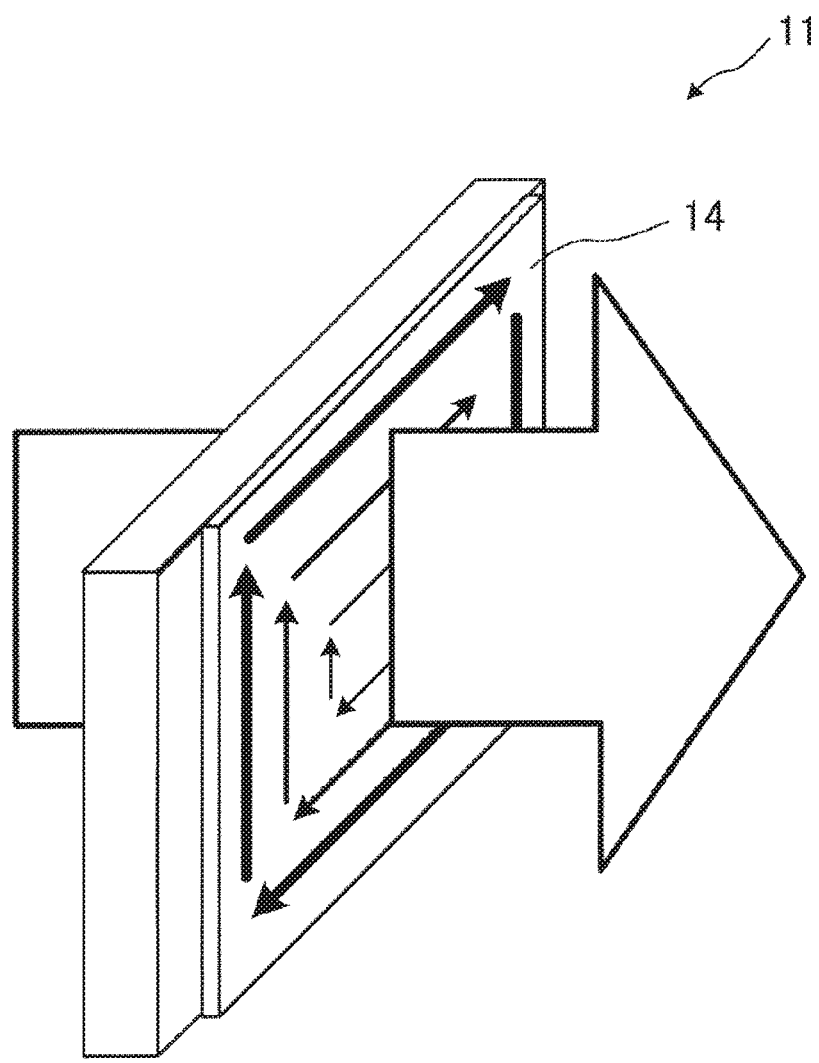
FIG. 4 is a view illustrating how a shielding current flows through a superconductive layer.

If a magnetic field is applied to such the ReBCO-based superconductive wire rod 11 being in a superconducting state, in the direction perpendicular to the tape surface of the wire rod, a shielding current flows through the superconductive layer 14 to prevent entrance of a magnetic flux into the superconductive layer 14 as illustrated in FIG. 4.

(Correction Coils)

Returning to FIG. 1, the correction coils 3 are coils that are disposed outside the main coil 2 by winding, around the center axis A, an NbTi superconductive wire rod which is one of metallic superconductive wire rods. The wire rod of the correction coils 3 is not restricted to the NbTi superconductive wire rod. The correction coils 3 consist of four correction coils 3a to 3d (first correction coil 3a, second correction coil 3b, third correction coil 3c, and fourth correction coil 3d) which are different from each other in the position in the Z-axis direction. The first correction coil 3a and the second correction coil 3b are arranged line-symmetrically with each other with respect to the axis B. The third correction coil 3c and the fourth correction coil 3d are arranged between the first correction coil 3a and the second correction coil 3b so as to be line-symmetrical with each other with respect to the axis B. These correction coils 3 generate a magnetic field for correcting the uniformity of a magnetic field generated by the main coil 2.

(Variable-Current Correction Coils)

The variable-current correction coils 4 are coils that are disposed inside the main coil 2 by winding, around the center axis A, an $Nb_3Sn$ superconductive wire rod which is one of metallic superconductive wire rods. The wire rod of the variable-current correction coils 4 is not restricted to the $Nb_3Sn$ superconductive wire rod. The variable-current correction coils 4 consist of six variable-current correction coils 4a to 4f (first variable-current correction coil 4a, second variable-current correction coil 4b, third variable-current correction coil 4c, fourth variable-current correction coil 4d, fifth variable-current correction coil 4e, and sixth variable-current correction coil 4f) which are different from each other in the position in the Z-axis direction. The first variable-current correction coil 4a and the second variable-current correction coil 4b are arranged line-symmetrically with each other with respect to the axis B. The third variable-current correction coil 4c and the fourth variable-current correction coil 4d are arranged between the first variable-current correction coil 4a and the second variable-current correction coil 4b so as to be line-symmetrical with each other with respect to the axis B. The fifth variable-current correction coil 4e and the sixth variable-current correction coil 4f are arranged between the third variable-current correction coil 3c and the fourth variable-current correction coil 3d so as to be line-symmetrical with each other with respect to the axis B. These variable-current correction coils 4 generate a magnetic field for correcting the uniformity of a magnetic field generated by the main coil 2. The variable-current correction coils 4 are energized by a power source that is different from a power source for energizing the main coil 2 and the correction coils 3, and their current values are made variable so as to be able to adjust to the degree of non-uniformity of a generated magnetic field.

(Magnetic Field Around the Center of Magnetic Field Generation Apparatus)

Here, in general, the magnetic field around the center of a magnetic field generation apparatus is given by Formula 1 and Formula 2.

[Math. 1]

$$B_z(r, \theta, \phi) = \sum_{n=0}^{n=\infty} \sum_{m=0}^{m=n} r^n P_n^m(\cos\theta)[A_{n+1}^{'m} \cos m\varphi + B_{n+1}^{'m} \sin m\phi] \quad \text{(Formula 1)}$$

$$\begin{aligned} B_z(x, y, z) = & \quad \text{(Formula 2)} \\ & A_{10} + A_{20}z + 3A_{21}x + 3B_{21}y + 3A_{10}(z^2 - (1/2)R^2) + \\ & 12A_{31}zx + 12B_{31}zy + 15A_{32}(x^2 - y^2) + 15B_{32}2xy \end{aligned}$$

Where the magnetic field is required to be high in uniformity as in a magnetic field generation apparatus for NMR, each of the coordinates-dependent magnetic field components should be equal to zero. In this case, Formula 2 is modified to Formula 3.

$$B_z(x,y,z)=A_{10} \quad \text{(Formula 3)}$$

It is ideal that each of the coordinates-dependent magnetic field components be made equal to zero in this manner, and designing is done so as to satisfy this requirement as precisely as possible. However, it may not be as designed because of certain situations of manufacture or environmental situations in installation. In view of the above, shim coils are used as a mechanism for adjusting a magnetic field so that each of the terms other than $A_{10}$ of Formula 2 is made equal to zero. Shim coils that use a superconductive wire rod are called superconducting shim coils, and shim coils that are used in a room temperature environment are called room-temperature shim coils. Superconducting shim coils and room-temperature shim coils are used together in many cases.

Shim coils used corresponding to each term of Formula 2 are called as follows. That is, shim coils corresponding to $A_{20}z$ are called Z1 shim coils, shim coils corresponding to $3A_{21}x$ are called X shim coils, and shim coils corresponding to $3B_{21}y$ are called Y shim coils. Shim coils corresponding to $3A_{30}(z^2-(\frac{1}{2})R^2)$ are called Z2 shim coils, shim coils corresponding to $12A_{31}zx$ are called ZX shim coils, and shim coils corresponding to $12B_{31}zy$ are called ZY shim coils.

If a magnetic field around the center of a magnetic field generation apparatus is symmetrical with respect to the plane that is perpendicular to the center axis A and rotation-symmetrical about the center axis A, the magnetic field around the center of the magnetic field generation apparatus is given by the following Formula 4.

$$B_z(z)=A_{10}+A_{20}z+3A_{30}z^2+ \quad \text{(Formula 4)}$$

In the following, the $z^2$ component and the $z^4$ component will be called a B2 component and a B4 component, respectively.

In magnetic field generation apparatus, taking the magnetic field generation efficiency into consideration, in many cases a main coil mainly for generating a magnetic field, a correction coil for roughly uniformizing the magnetic field generated by the main coil, and a shim coil for adjusting the field generated by the main coil are arranged in this order from the side closer to the coil center. This is because the main coil and the correction coil intend to generate a magnetic field around the coil center and arranging these closer to the coil center increases the magnetic field generation efficiency and hence can decrease the overall size (or weight) of the apparatus.

(Configuration of Conventional Magnetic Field Generation Apparatus)

Figure 5:
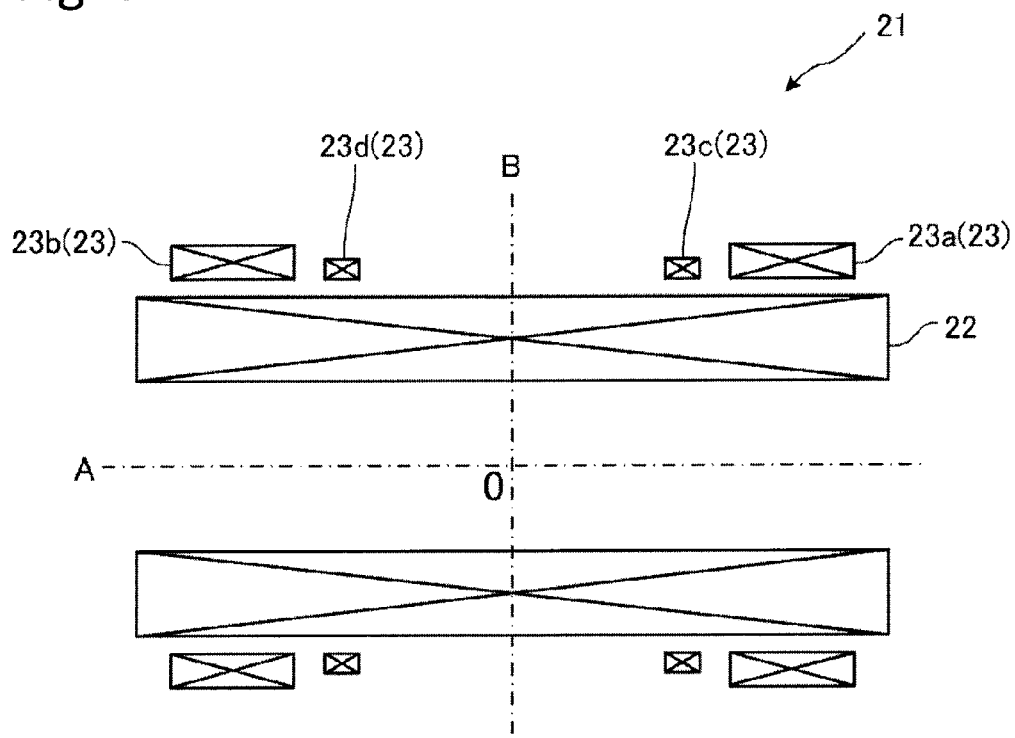
FIG. 5 is a schematic sectional view illustrating a magnetic field generation apparatus.

Here, the configuration of a conventional magnetic field generation apparatus 21 is illustrated in FIG. 5. The magnetic field generation apparatus 21 is equipped with a main coil 22 which is formed by winding a ReBCO-based superconductive wire rod and plural correction coils 23 which are coaxial with the main coil 22 and disposed outside the main coil 22. That is, the magnetic field generation apparatus 21 is not equipped with the variable-current correction coils 4, thereby being different from the magnetic field generation apparatus 1 according to the embodiment.

The correction coils 23 are coils that are formed by winding an NbTi superconductive wire rod around the center axis A. The correction coils 23 consist of four correction coils 23a to 23d (first correction coil 23a, second correction coil 23b, third correction coil 23c, and fourth correction coil 23d) which are different from each other in the position in the Z-axis direction. The first correction coil 23a and the second correction coil 23b are arranged line-symmetrically with each other with respect to the axis B. The third correction coil 23c and the fourth correction coil 23d are arranged between the first correction coil 23a and the second correction coil 23b so as to be line-symmetrical with each other with respect to the axis B. These correction coils 23 generate a magnetic field for correcting the uniformity of a magnetic field generated by the main coil 22.

To generate, in the measurement space, a magnetic field of 14.1 T which causes a hydrogen nucleus magnetic resonance frequency of 600 MHz by using the magnetic field generation apparatus 21, the parameters of the respective coils are set as shown in Table 1.

TABLE 1

| | Inner dia. (mm) | Outer dia. (mm) | Winding width (mm) | Coil center position (mm) | Number of turns | Number of layers | Wire rod width (mm) | Wire rod thickness mm) |
|---|---|---|---|---|---|---|---|---|
| Main coil | 81.00 | 171.00 | 360.00 | 0.00 | 12960.0 | 180 | 5.00 | 0.25 |
| 1st correction coil | 183.00 | 213.52 | 57.79 | 132.76 | 742.2 | 14 | Circular wire of outer diameter 1.09 mm | |
| 2nd correction coil | 183.00 | 213.52 | 57.79 | −132.76 | 742.2 | 14 | | |
| 3rd correction coil | 183.00 | 196.08 | 16.67 | 80.53 | −91.8 | 6 | | |
| 4th correction coil | 183.00 | 196.08 | 16.67 | −80.53 | −91.8 | 6 | | |

The magnetic field generation apparatus 21 is designed so as to generate a magnetic field of 600 MHz in the measurement space when energized at 319.08 A. In this design, no consideration is given to the influence of a shielding current. The magnetic field generation apparatus 21 is designed so as to provide magnetic field components:

$$B2=1.021\times 10^{-5} \text{ ppm/cm}^2$$

$$B4=-1.755\times 10^{-8} \text{ ppm/cm}^4$$

in the measurement space and hence be very high in magnetic field uniformity.

Figure 6:
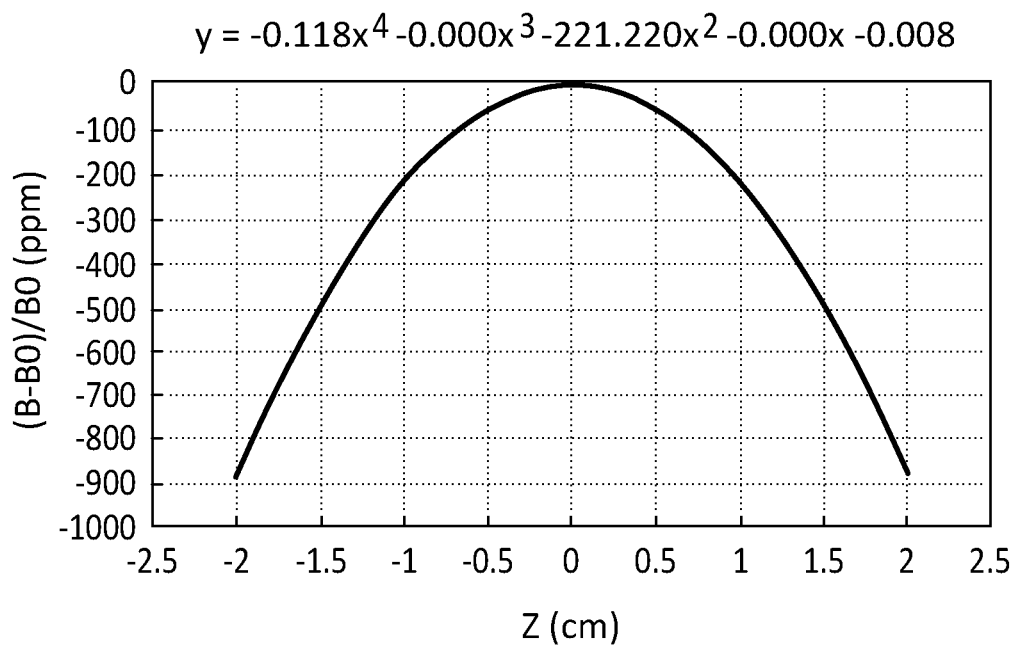
FIG. 6 is a view showing a magnetic field on the Z axis.

However, when the magnetic field generation apparatus 21 was energized in a low-temperature, superconducting state, a magnetic field on the Z-axis was as shown in FIG. 6. This magnetic field had magnetic field components:

$$B2=-221.22 \text{ ppm/cm}^2$$

$$B4=-0.12 \text{ ppm/cm}^4$$

in which the B2 component had a very large negative value.

To generate a central magnetic field of 600 MHz by using this magnetic field generation apparatus 21, 327.14 A was necessary, that is, a current larger than the design value by about 2.5% was necessary.

The main coil 22 itself of the magnetic field generation apparatus 21 provides magnetic field components:

$$B2=-432.46 \text{ ppm/cm}^2$$

$$B4=-1.54 \text{ ppm/cm}^4$$

The above-mentioned highly uniform magnetic field should be generated through cancellation of them by $$B2=+432.46 \text{ ppm/cm}^2$$

$$B4=+1.54 \text{ ppm/cm}^4$$

that are provided by the four correction coils 23.

However, it is considered that, since the correction coils 23 generated a magnetic field that was perpendicular to the tape surface of the ReBCO-based superconductive wire rod of the main coil 22, a shielding current flowing through the superconductive layer of the ReBCO-based superconductive wire rod decreased the magnetic field generated by the correction coils 23 and, as a result, the magnetic field components as shown in FIG. 6 were produced.

In particular, as for the B2 component, it is considered that for B2=−432.46 ppm/cm² provided by the main coil 22, the correction coils 23 provided B2=+211.26 ppm/cm² which accounted for 48.85% of B2=+432.46 ppm/cm² and they added up to B2=−432.46+211.26=−221.22 ppm/cm², that is, about half of the B2 component provided by the correction coils 23 was shielded.

(Configuration of Improved Magnetic Field Generation Apparatus)

Figure 7:
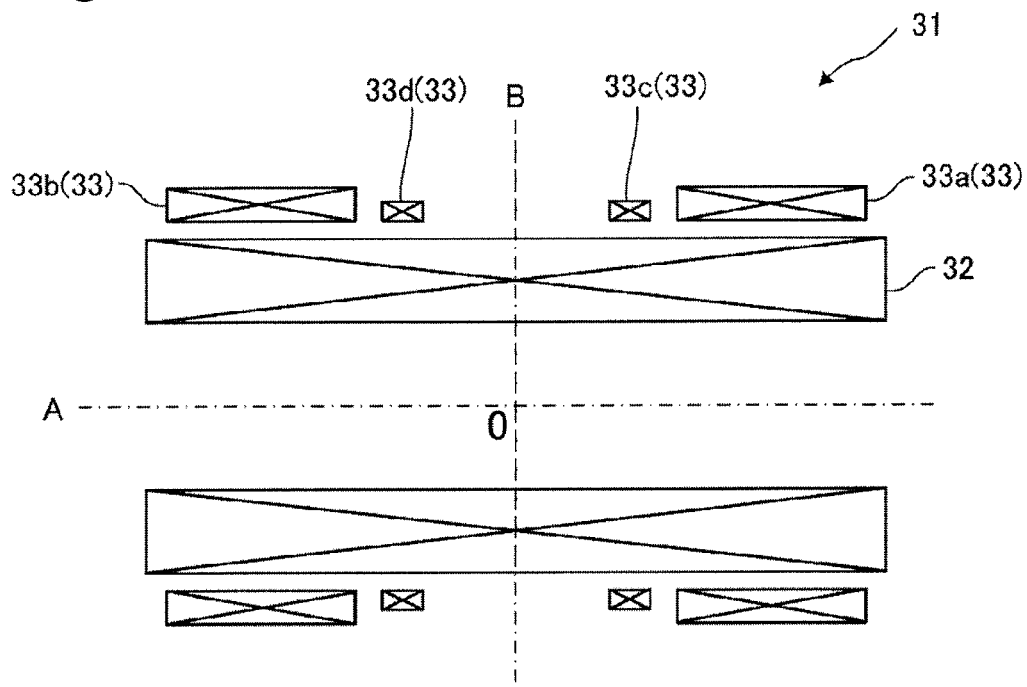
FIG. 7 is a schematic sectional view illustrating a magnetic field generation apparatus.

In view of the above, designing was performed taking the magnetic field weakening due to a shielding current into consideration from the first, whereby a magnetic field generation apparatus 31 was obtained by improving the magnetic field generation apparatus 21 illustrated in FIG. 5. The magnetic field generation apparatus 31 is illustrated in FIG. 7. The magnetic field generation apparatus 31 is equipped with a main coil 32 which is formed by winding a ReBCO-based superconductive wire rod and plural correction coils 33 which are coaxial with the main coil 32 and disposed outside the main coil 32. This configuration is the same as the magnetic field generation apparatus 21 illustrated in FIG. 5. However, the number of turns of the correction coils 33 of the magnetic field generation apparatus 31 is larger than that of the correction coils 23 illustrated in FIG. 5. That is, the correction coils 33 of the magnetic field generation apparatus 31 can generate a stronger magnetic field than the correction coils 23 of the magnetic field generation apparatus 21.

The correction coils 33 are coils that are formed by winding an NbTi superconductive wire rod around the center axis A. The correction coils 33 consist of four correction coils 33a to 33d (first correction coil 33a, second correction coil 33b, third correction coil 33c, and fourth correction coil 33d) which are different from each other in the position in the Z-axis direction. The first correction coil 33a and the second correction coil 33b are arranged line-symmetrically with each other with respect to the axis B. The third correction coil 33c and the fourth correction coil 33d are arranged between the first correction coil 33a and the second correction coil 33b so as to be line-symmetrical with each other with respect to the axis B.

To generate, in the measurement space, a magnetic field of 14.1 T which causes a hydrogen nucleus magnetic resonance frequency of 600 MHz by using the magnetic field generation apparatus 31, the parameters of the respective coils are set as shown in Table 2.

TABLE 2

|  | Inner dia. (mm) | Outer dia. (mm) | Winding width (mm) | Coil center position (mm) | Number of turns | Number of layers | Wire rod width (mm) | Wire rod thickness (mm) |
|---|---|---|---|---|---|---|---|---|
| Main coil | 183.00 | 171.00 | 360.00 | 0.00 | 12960.0 | 180 | 5.00 | 0.25 |
| 1st correction coil | 183.00 | 213.52 | 87.91 | 123.87 | 1129.2 | 14 | Circular wire of outer diameter 1.09 mm | |
| 2nd correction coil | 183.00 | 213.52 | 87.91 | −123.87 | 1129.2 | 14 | | |
| 3rd correction coil | 183.00 | 196.08 | 18.99 | 55.42 | −104.5 | 6 | | |
| 4th correction coil | 183.00 | 196.08 | 18.99 | −55.42 | −104.5 | 6 | | |

Figure 8:
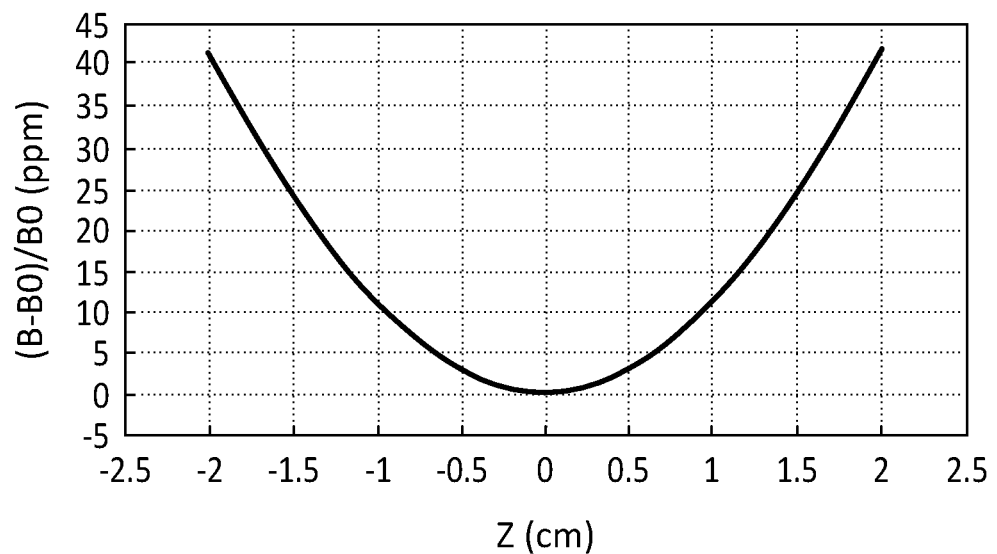
FIG. 8 is a view showing a magnetic field on the Z axis.

When the magnetic field generation apparatus 31 was energized in a low-temperature, superconducting state, a magnetic field on the Z-axis was as shown in FIG. 8. This magnetic field has magnetic field components:

$$B2=+11.146 \text{ ppm/cm}^2$$

$$B4=-0.199 \text{ ppm/cm}^4$$

and it is seen that the magnetic field generated is higher in uniformity than the magnetic field generation apparatus 21 illustrated in FIG. 5.

The weights of the wire rod used in the magnetic field generation apparatus 21 illustrated in FIG. 5 were 51.3 kg for the main coil 22, 6.7 kg for the correction coils 23 and 58.0 kg in total. In contrast, the weights of the wire rod used in the magnetic field generation apparatus 31 illustrated in FIG. 7 were 51.3 kg for the main coil 32, 9.9 kg for the correction coils 33 and 61.2 kg in total. That is, the magnetic field generation apparatus 31 required, compared with the magnetic field generation apparatus 21 which is before the improvement, the wire rod for the correction coils in larger amount by 3.2 kg, that is, required the wire rod for the correction coils in an extra 48%. It can be said that this weight increase is due to the size increase in the correction coils that was made to compensate for the weakening of the correction coil magnetic field due to a shielding current.

(Configuration of Further Improved Magnetic Field Generation Apparatus)

Figure 9:
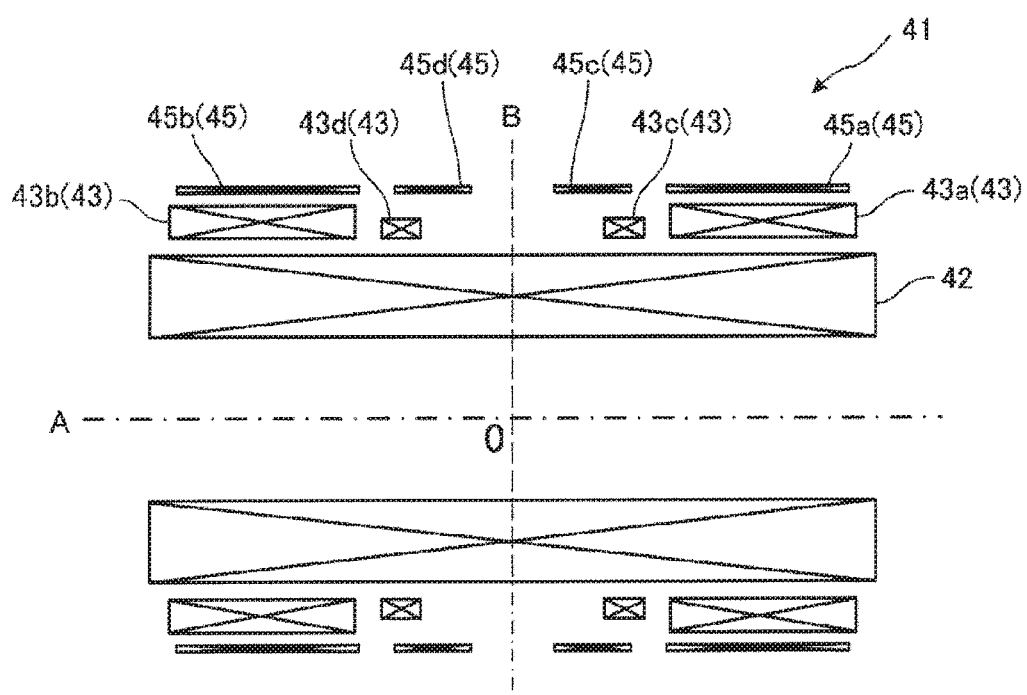
FIG. 9 is a schematic sectional view illustrating a magnetic field generation apparatus.

In view of the above, a further improved magnetic field generation apparatus 41 was obtained by disposing Z2 shim coils for correcting the B2 component outside of the correction coils 33 in the magnetic field generation apparatus 31 illustrated in FIG. 7. The magnetic field generation apparatus 41 is illustrated in FIG. 9. The magnetic field generation apparatus 41 is equipped with a main coil 42 which is formed by winding a ReBCO-based superconductive wire rod, plural correction coils 43 which are coaxial with the main coil 42 and disposed outside the main coil 42, and the plural Z2 shim coils 45 which are coaxial with the main coil 42 and disposed outside the correction coils 43. The configuration of the magnetic field generation apparatus 41 is the same as that of the magnetic field generation apparatus 31 illustrated in FIG. 7 except that the former is equipped with the Z2 shim coils 45.

The Z2 shim coils 45 are coils that are formed by winding an Nb$_3$Sn superconductive wire rod around the center axis A. The wire rod of the Z2 shim coils 45 is not restricted to an Nb$_3$Sn superconductive wire rod. The Z2 shim coils 45 consist of four Z2 shim coils 45a to 45d (first shim coil 45a, second shim coil 45b, third shim coil 45c, and fourth shim coil 45d) which are different from each other in the position in the Z-axis direction. The first shim coil 45a and the second shim coil 45b are arranged line-symmetrically with each other with respect to the axis B. The third shim coil 45c and the fourth shim coil 45d are arranged between the first shim coil 45a and the second shim coil 45b so as to be line-symmetrical with each other with respect to the axis B. Where no consideration is given to a shielding current, the Z2 shim coils 45 can produce a B2 component of +/−54.73 ppm/cm$^2$ when energized at +/−20 A.

To generate, in the measurement space, a magnetic field of 14.1 T which causes a hydrogen nucleus magnetic resonance frequency of 600 MHz by using the magnetic field generation apparatus 41, the parameters of the respective coils are set as shown in Table 3.

TABLE 3

| | Inner dia. (mm) | Outer dia. (mm) | Winding width (mm) | Coil center position (mm) | Number of turns | Number of layers | Wire rod width (mm) | Wire rod thickness (mm) |
|---|---|---|---|---|---|---|---|---|
| Main coil | 81.00 | 171.00 | 360.00 | 0.00 | 12960.0 | 180 | 5.00 | 0.25 |
| 1st correction coil | 183.00 | 213.52 | 87.91 | 123.87 | 1129.2 | 14 | Circular wire of outer diameter 1.09 mm | |
| 2nd correction coil | 183.00 | 213.52 | 87.91 | −123.87 | 1129.2 | 14 | | |
| 3rd correction coil | 183.00 | 196.08 | 18.99 | 55.42 | −104.5 | 6 | | |
| 4th correction coil | 183.00 | 196.08 | 18.99 | −55.42 | −104.5 | 6 | | |
| 1st shim coil | 227.52 | 230.69 | 88.00 | 121.51 | 796.0 | 4 | Circular wire of outer diameter 0.44 mm | |
| 2nd shim coil | 227.52 | 230.69 | 88.00 | −121.51 | 796.0 | 4 | | |
| 3rd shim coil | 227.52 | 230.69 | 36.92 | 39.05 | −331.6 | 4 | | |
| 4th shim coil | 227.52 | 230.69 | 36.92 | −39.05 | −331.6 | 4 | | |

Figure 10:
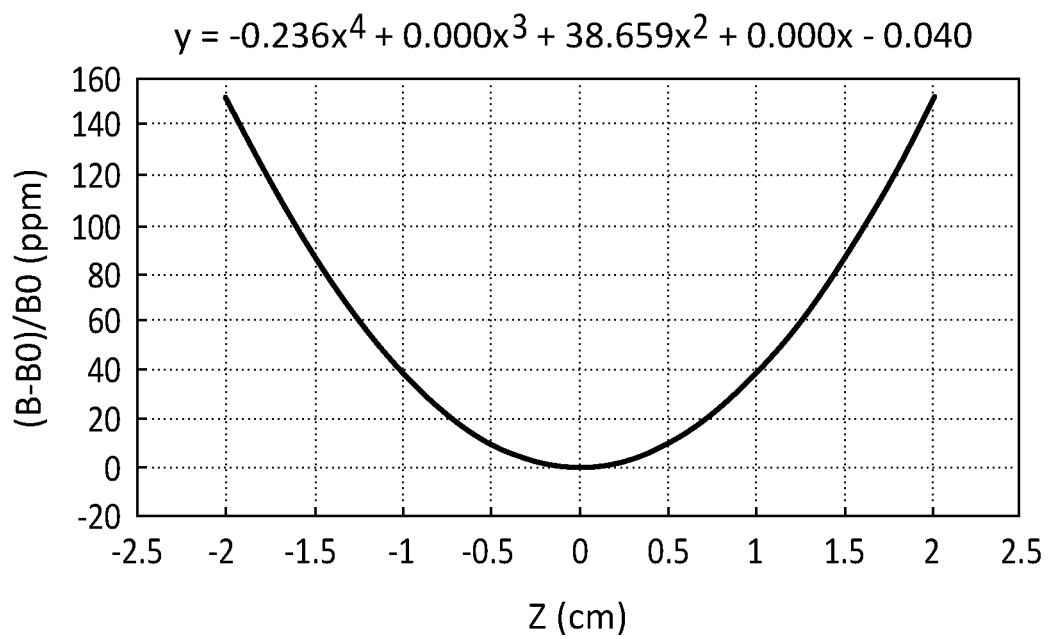
FIG. 10 is a view showing a magnetic field on the Z axis.
Figure 10:
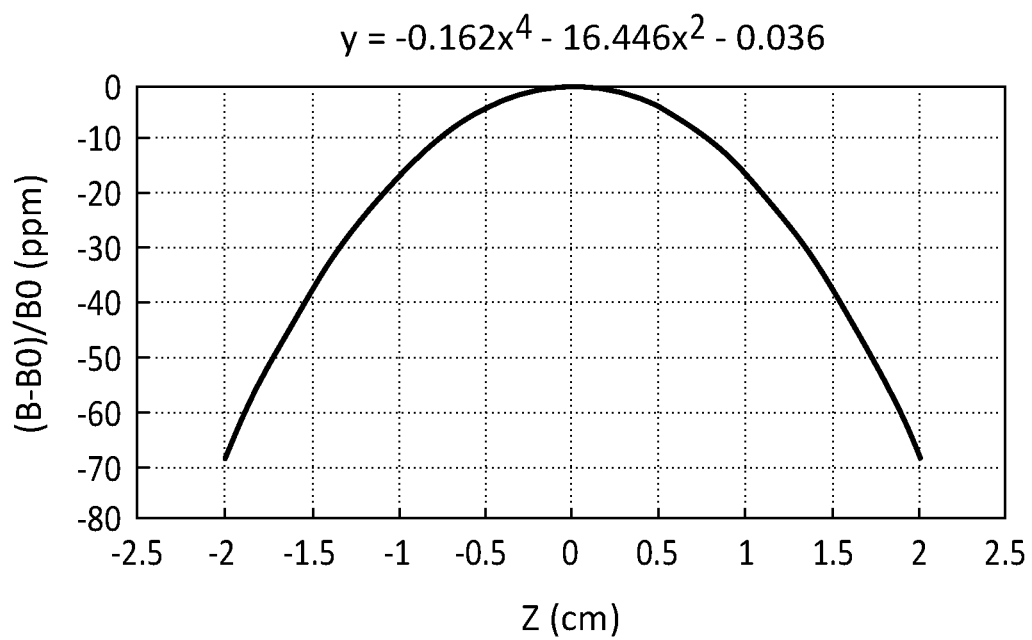

When the magnetic field generation apparatus 41 was energized in a low-temperature, superconducting state, a magnetic field on the Z-axis was as shown in FIG. 10. When the Z2 shim coils 45 were energized at +20 A, the magnetic field generation apparatus 41 has magnetic field components:

$B2=+38.659$ ppm/cm$^2$ $B4=-0.236$ ppm/cm$^4$, and when the Z2 shim coils 45 were energized at −20 A, it has magnetic field components:

$B2=-16.446$ ppm/cm$^2$ $B4=-0.162$ ppm/cm$^4$.

These results show that an intensity of $B2=27.55$ ppm/cm$^2$@20 A was exhibited. Since this value accounts for about 50% of 54.73 ppm/cm$^2$ which is the value of the case that no consideration is given to a shielding current, it is considered that the magnetic field generated by the Z2 shim coils 45 was shielded by approximately the same degree as the magnetic field generated by the correction coils 23 of the magnetic field generation apparatus 21 illustrated in FIG. 5 was shielded. A wire rod of 1.56 kg was necessary for the Z2 shim coils 45.

Although the above description has been mainly directed to the 82 component that is shielded by a shielding current flowing through the superconductive layer of the ReBCO-based superconductive wire rod, the components other than the B2 component are also shielded by a shielding current in the same manner. However, the degree of the shielding is lower than that in the B2 component. For example, in the case of coils for correcting the B1 component, a magnetic field component (hereinafter referred to as the perpendicular component of a magnetic field) venerated by the coils and applied perpendicular to the tape surface of the ReBCO-based superconductive wire rod is opposite in polarity on the left side and the right side of the axis B. Therefore, on either the left side or the right side of the axis B, the perpendicular component of a magnetic field of coils for correcting the B1 component has the same polarity as the perpendicular component of a magnetic field of the main coil. As a result, these perpendicular components add up to increase the magnetic field perpendicular component and thereby facilitate complete entrance of the magnetic flux. The effect of the magnetic field being shielded is thus lowered. On the other hand, the coils for correcting the B2 component include coils which have a line-symmetrical relation with each other with respect to the axis B and present at positions near the axis B. In these regions, the perpendicular component of the magnetic field generated by the main coil itself is small. Therefore, complete entrance of a magnetic flux does not tend to occur, as a result of which a magnetic field of the coils for correcting the B2 component is prone to be shielded.

(Magnetic Field Around the Center of Magnetic Field Generation Apparatus According to Embodiment)

In view of the above, in the embodiment, as illustrated in FIG. 1 the six variable-current correction coils 4 are disposed inside the main coil 2. To generate, in the measurement space, a magnetic field of 14.1 T which causes a hydrogen nucleus magnetic resonance frequency of 600 MHz by using the magnetic field generation apparatus 1, the parameters of the respective coils are set as shown in Table 4.

TABLE 4

| | Inner dia. (mm) | Outer dia. (mm) | Winding width (mm) | Coil center position (mm) | Number of turns | Number of layers | Wire rod width (mm) | Wire rod thickness (mm) |
|---|---|---|---|---|---|---|---|---|
| Main coil | 92.00 | 182.00 | 360.00 | 0.00 | 12960.0 | 180 | 5.00 | 0.25 |
| 1st correction coil | 194.00 | 224.52 | 96.47 | 131.66 | 1239.1 | 14 | Circular wire of outer diameter 1.09 mm | |
| 2nd correction coil | 194.00 | 224.52 | 96.47 | −131.66 | 1239.1 | 14 | | |
| 3rd correction coil | 194.00 | 224.52 | 13.15 | 47.77 | −168.9 | 14 | | |
| 4th correction coil | 194.00 | 224.52 | 13.15 | −47.77 | −168.9 | 14 | | |
| 1st variable-current correction coil | 81.00 | 84.55 | 73.23 | 133.72 | 152.2 | 2 | Circular wire of outer diameter 0.95 mm | |
| 2nd variable-current correction coil | 81.00 | 84.55 | 73.2 | −133.72 | 152.2 | 2 | | |
| 3rd variable-current correction coil | 81.00 | 84.55 | −3.69 | 41.27 | 9.8 | 2 | | |
| 4th variable-current correction coil | 81.00 | 84.55 | −3.69 | −41.27 | 9.8 | 2 | | |
| 5th variable-current correction coil | 81.00 | 84.55 | −4.42 | 12.08 | −11.3 | 2 | | |
| 6th variable-current correction coil | 81.00 | 84.55 | −4.42 | −12.08 | −11.3 | 2 | | |

Figure 11:
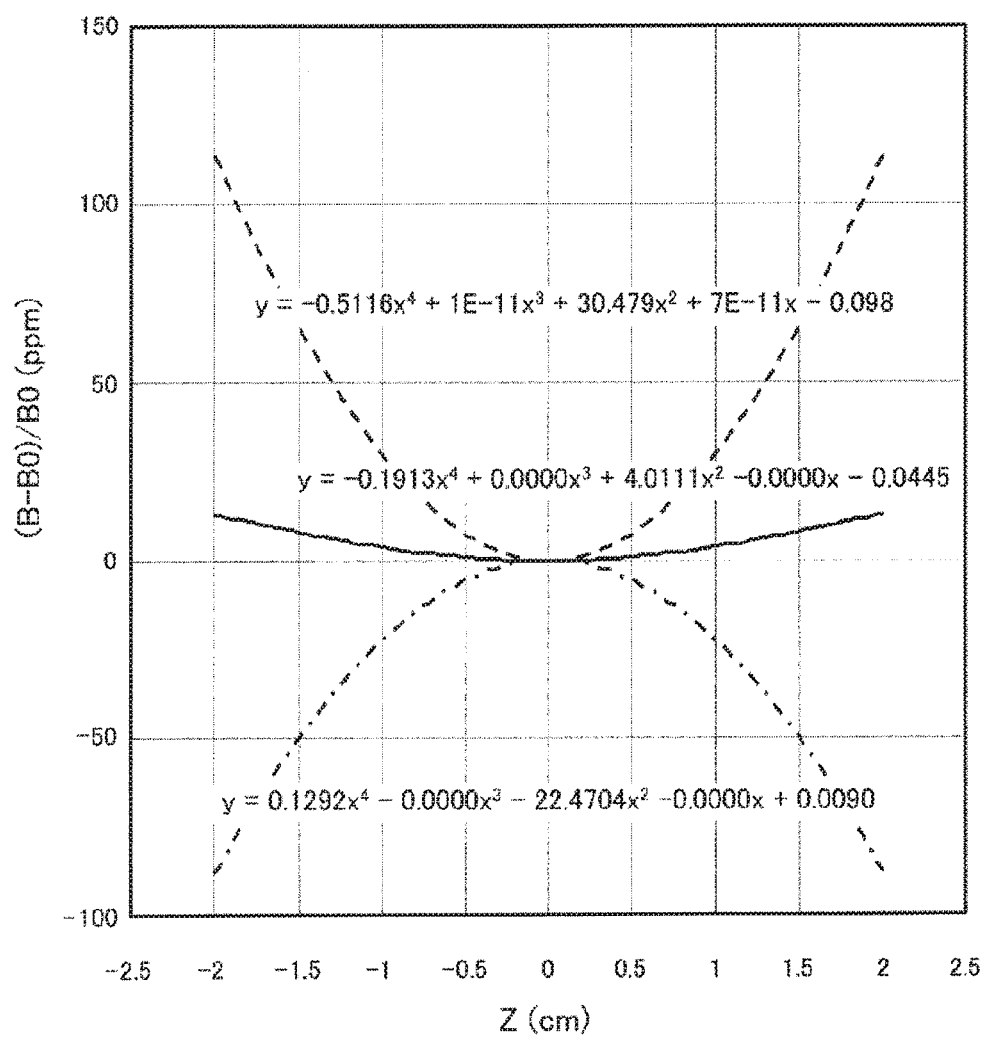
FIG. 11 is a view showing magnetic fields on the Z axis.

When the magnetic field generation apparatus 1 was energized in a low-temperature, superconducting state, a magnetic field on the Z-axis was as shown in FIG. 11. When the variable-current correction coils 4 were not energized, the magnetic field generation apparatus 1 provided magnetic field distribution:

$$B2 = +4.011 \text{ ppm/cm}^2$$

$$B4 = -0.191 \text{ ppm/cm}^4.$$

When the variable-current correction coils 4 were energized at +20 A, magnetic field distribution:

$B2=+30.479$ ppm/cm$^2$ $B4=-0.512$ ppm/cm$^4$ was provided. When the variable-current correction coils 4 were energized at −20 A, magnetic field distribution:

$B2=-22.470$ ppm/cm$^2$ $B4=+0.129$ ppm/cm$^4$ was provided. These results show that an intensity of $B2=26.47$ ppm/cm$^2$@20 A was exhibited. Since this value accounts for about 72% of 37 ppm/cm$^2$ which is the value of the case that no consideration is given to a shielding current, it can be seen that a magnetic field generated by the variable-current correction coils 4 disposed inside the main coil 2 which is formed by winding a ReBCO-based superconductive wire rod is less prone to be affected by a shielding current. This is because whereas the measurement space is located inside the main coil 2 and hence a correcting magnetic field coming from outside the main coil 2 is directly affected by a shielding current until reaching the measurement space, a correcting magnetic field coming from inside the main coil 2 reaches the measurement space receiving almost no influence from the shielding current.

The weights of the wire rod used in the magnetic field generation apparatus 41 illustrated in FIG. 9 were 51.3 kg for the main coil 42, 9.9 kg for the correction coils 43, 1.6 kg for the Z2 shim coils 45, and 62.8 kg in total. In contrast, the weights of the wire rod used in the magnetic field generation apparatus 1 according to the embodiment were 55.8 kg for the main coil 2, 11.4 kg for the correction coils 3, 0.4 kg for the variable-current correction coils 4, and 67.2 kg in total. That is, the magnetic field generation apparatus 1 according to the embodiment has a larger weight than the magnetic field generation apparatus 41 illustrated in FIG. 9. However, whereas the outermost diameter of the magnetic field generation apparatus 41 illustrated in FIG. 9 is 230.7 mm, the outermost diameter of the magnetic field generation apparatus 1 according to the embodiment is 224.5 mm; that is, the magnetic field generation apparatus 1 according to the embodiment is smaller by about 2.7%.

As described above, a magnetic field generated by the variable-current correction coils 4 which are disposed inside the main coil 2 receives almost no influence from a shielding current flowing through the superconductive layer of the ReBCO-based superconductive wire rod. Therefore, the uniformity of a magnetic field generated by the main coil 2 can be corrected efficiently by a magnetic field generated by the variable-current correction coils 4 and hence the magnetic field uniformity can be increased. Furthermore, since the variable-current correction coils 4 are disposed inside the main coil 2, increase of the overall size of the apparatus can be more suppressed than in a case that correction coils or shim coils are disposed outside the main coil 2.

Since the variable-current correction coils 4 are coils for generating a magnetic field for correcting the uniformity of a magnetic field generated by the main coil 2, it is desirable that no shielding current is generated in themselves. It is therefore desirable that the variable-current correction coils 4 be produced by using a metallic superconductive wire rod (e.g., NbTi wire, Nb$_3$Sn wire, or Nb$_3$Al wire) or a bismuth-based superconductive wire rod, that is a wire rod in which a sealing current is less prone to be generated. The bismuth-based superconductive wire rod is one of oxide superconductive wire rods. The variable-current correction coils 4 made of any of these kinds of wire rods can suitably correct the uniformity of a magnetic field generated by the main coil 2.

A shielding current flowing through the superconductive layer of a ReBCO-based superconductive wire rod is not a permanent current and varies over a long period (on the order of a month or year). In conventional magnetic field generation apparatus, an adjustment for increasing the uniformity of a magnetic field is made by using shim coils after a central magnetic field is generated in the measurement space by energizing a main coil and correction coils. This adjustment needs to be made at an operation site because the uniformity of a magnetic field is also affected by an installation environment. However, when the shim coils that are located outside the correction coils are energized, a large shielding current is generated in the main coil. Thereafter, the shielding current varies over along period, which necessitates frequent adjustments by the shim coils. On the other hand, in the magnetic field generation apparatus 1 according to the embodiment, when the variable-current correction coils 4 which are located inside the main coil 2 are energized, only a small shielding current is generated. Therefore, even if the shielding current varies over time, it has only a little influence on the magnetic field and hence it is not necessary to make frequent adjustments by the variable-current correction coils 4. This is another advantage of the use of the variable-current correction coils 4.

Furthermore, since it is difficult to calculate a shielding current completely and to have it reflected in designing, the coil configuration of the magnetic field generation apparatus 1 according to the embodiment in which the effect of a shielding current is small is advantageous in that the differences between a design and a practice can be made small.

Still further, in the magnetic field generation apparatus 1 according to the embodiment, either of the main coil 2 and the variable-current correction coils 4 is driven in an energization mode in which an external power source is used and the other is driven in a permanent current mode. Driving either of the main coil 2 and the variable-current correction coils 4 in the permanent current mode makes it possible to obtain a magnetic field that is highly stable regarding time utilizing the magnetic flux conservation in a superconducting state. The term "energization mode in which an external power source is used" means a mode in which a current is supplied from an external power source. The permanent current mode is a mode in which a current once supplied externally continues to flow through a closed loop made of a superconductive material and no further supply of a current from outside is necessary. Alternatively, both of the main coil 2 and the variable-current correction coils 4 may be driven in the permanent current mode. In this case, a magnetic field that is highly stable regarding time can be obtained in both coils. Further alternatively, both of the main coil 2 and the variable-current correction coils 4 may be driven in the energization mode in which an external power source is used. In this case, the apparatus can be constructed without using superconducting connection that is difficult to be realized at present with a ReBCO-based superconductive wire rod.

(Modifications)

The magnetic field generation apparatus 1 according to the embodiment may further be equipped with plural shim coils that are coaxial with the main coil 2 and disposed outside the correction coils 3. The shim coils are coils that are disposed outside the correction coils 3 by winding an Nb$_3$Sn superconductive wire rod around the center axis A. The wire rod of the shim coils is not restricted to an Nb$_3$Sn superconductive wire rod. The shim coils are energized by a power source that is different from a power source for energizing the main coil 2 and the correction coils 3, and their current values are made variable. These shim coils generate a magnetic field for correcting particular magnetic field components of a magnetic field generated by the main coil 2. More specifically, they generate a magnetic field for decreasing the magnetic field components other than the B2 component to zero. That is, whereas the B2 component is adjusted by the variable-current correction coils 4 which are disposed inside the main coil 2 because it is prone to be affected by a shielding current, the magnetic field components other than the B2 component are adjusted by the shim coils which are disposed outside the correction coils 3 because their ratio shielded is small. Correcting, in this manner, by the shim coils, magnetic field components that cannot be corrected by the variable-current correction coils 4 makes it possible to increase the uniformity of a magnetic field further.

Although the shim coils may be disposed inside the main coil 2 or between the main coil 2 and the correction coils 3, it is preferable that they be disposed outside the correction coils 3. This is because disposing the shim coils outside the correction coils 3 makes it possible to place the main coil 2 and the correction coils 3 closer to the coil center and hence to increase the magnetic field generation efficiency or decrease the overall size (or weight) of the apparatus.

In magnetic field generation apparatus 1 according to the embodiment, the correction coils 3 are designed so as to uniformize a magnetic field taking the effect of a shielding current into consideration in a case that the variable-current correction coils 4 are not energized. Alternatively, the overall weight or size of the apparatus may be optimized by increasing the ability of the variable-current correction coils 4 and making the correction coils 3 smaller. That is, with a notation that the B2 component of the main coil 2, the B2 component of the correction coils 3, and the B2 component of the variable-current correction coils 4 are represented by B2(main), B2(comp), and B2(inner-comp), respectively, the B2 component of the magnetic field generation apparatus 1 is given by $$B2=B2(\text{main})+B2(\text{comp})+B2(\text{inner-comp}).$$

In the embodiment, B2(main)+B2(comp) is set to be "0" and the following is satisfied:

$$B2(\text{inner-comp})=+/-26.47 \text{ ppm/cm}^2 @+/-20 \text{ A}.$$

On the other hand, "increasing the ability of the variable-current correction coils 4 and making the correction coils 3 smaller" means, specifically, to satisfy the following:

$$B2=B2(\text{main})+B2(\text{comp})=-20 \text{ ppm/cm}^2$$

and to satisfy the following:

$$B2(\text{inner-comp})=+46.47 \text{ ppm/cm}^2 \text{ to } +6.47 \text{ ppm/cm}^2@+/-20 \text{ A}.$$

The magnetic field generation apparatus 1 according to the embodiment may further be equipped with plural magnetic shims that are disposed in the measurement space. These magnetic shims are made of iron, for example, and increase the uniformity of a magnetic field generated by the main coil 2. This makes it possible to increase the uniformity of a magnetic field further.

The magnetic field generation apparatus 1 according to the embodiment may further be equipped with, in addition to the plural magnetic shims disposed in the measurement space, a room-temperature shim coils automatic adjusting mechanism that is disposed on the side of the outer circumferences of the magnetic shims and compensates for a temporal magnetic field variation due to a temperature variation of the magnetic shims. Compensating for a magnetic field temporal variation due to a temperature variation of the magnetic shims by means of the room-temperature shim coils automatic adjusting mechanism makes it possible to increase the temporal stability of the uniformity of a magnetic field.

(Advantages)

As described above, in the magnetic field generation apparatus 1 according to the embodiment, the variable-current correction coils 4 which generate a magnetic field for correcting the uniformity of a magnetic field generated by the main coil 2 is disposed inside the main coil 2. Where correction coils or shim coils are disposed outside the main coil 2, since they generate a magnetic field that is perpendicular to the tape surface of the ReBCO-based superconductive wire rod of the main coil 2, a shielding current flows through the superconductive layer of the ReBCO-based superconductive wire rod and this shielding current decreases a magnetic field generated by the correction coils or shim coils. As a result, the magnetic field uniformity is lowered. In contrast, a magnetic field generated by the variable-current correction coils 4 which are disposed inside the main coil 2 receives almost no influence from a shielding current flowing through the superconductive layer of the ReBCO-based superconductive wire rod. Therefore, the uniformity of the magnetic field generated by the main coil 2 can be corrected efficiently by the magnetic field generated by the variable-current correction coils 4 and hence the magnetic field uniformity can be increased. Furthermore, disposing the variable-current correction coils 4 inside the main coil 2 can suppress increase of the overall size or increase of weight of the apparatus more than in the case that correction coils or shim coils are disposed outside the main coil 2.

The variable-current correction coils 4 are formed by winding a metallic superconductive wire rod or a bismuth-based superconductive wire rod. Since the variable-current correction coils 4 are coils for generating a magnetic field for correcting the uniformity of a magnetic field generated by the main coil 2, it is desirable that no shielding current is generated in themselves. Since the metallic superconductive wire rod and the bismuth-based superconductive wire rod are wire rods in which a shielding current is less prone to be generated, the variable-current correction coils 4 made of such a wire rod can suitably correct the uniformity of a magnetic field generated by the main coil 2.

The magnetic field uniformity can be increased further by correcting the uniformity of a magnetic field generated by the main coil 2 by the correction coils 3 disposed outside the main coil 2.

The magnetic field uniformity can be increased further by correcting particular magnetic field components of a magnetic field generated by the main coil 2 by the shim coils disposed outside the main coil 2. In particular, the magnetic field uniformity can be increased even further by correcting magnetic field components that cannot be corrected by the variable-current correction coils 4.

Operating either of the main coil 2 and the variable-current correction coils 4 in the permanent current mode makes it possible to obtain a magnetic field that is highly stable regarding time utilizing the magnetic flux preservation in a superconducting state.

The magnetic field uniformity can be increased even further by increasing the uniformity of a magnetic field generated by the main coil 2 by the magnetic shims.

Compensating for a magnetic field temporal variation due to a temperature variation of the magnetic shims by means of the room-temperature shim coils automatic adjusting mechanism makes it possible to increase the temporal stability of the uniformity of a magnetic field.

Modifications to Embodiment

The embodiments of the present invention have been described above. However, they are just specific examples and they do not limit the present invention in particular. Their specific structures etc. can be modified in design as appropriate. The workings and advantages described in the embodiments of the invention are the exemplification of most preferable workings and advantages derived from the present invention, and the workings and advantages of the present invention are not limited to the ones described in the embodiments of the present invention.

For example, whereas the magnetic field generation apparatus 1 according to the embodiment is equipped with the correction coils 3, the correction coils 3 may be omitted. In this case, each of the magnetic field components from the B2 component down is adjusted by the variable-current correction coils 4.

The variable-current correction coils 4 may be one formed by winding a ReBCO-based superconductive wire rod. In this case, a shielding current flows through the variable-current correction coils 4. However, since the variable-current correction coils 4 receive almost no influence from a shielding current flowing through the main coil 2, the uniformity of a magnetic field generated by the main coil 2 can be corrected properly.

There are magnetic field generation apparatus in which, to weaken leakage magnetic fields generated by the magnetic field generation apparatus therearound, a shield coil coaxial with a main coil and the correction coils is disposed outside correction coils or shim coils in the radial direction. The present invention can also be applied to those apparatus.

DESCRIPTION OF SYMBOLS

1, 21, 31, 41 Magnetic field generation apparatus
2, 22, 32, 42 Main coil
3, 23, 33, 43 Correction coil
4 Variable-current correction coil
11 ReBCO-based superconductive wire rod
12 Substrate
13 Buffer layer
14 Superconductive layer
15 Stabilization layer
16 Electric insulation member
45 Shim coil

The invention claimed is:

1. A magnetic field generation apparatus comprising:
a main coil which is formed by winding a rare earth barium-copper-oxide (ReBCO)-based superconductive wire rod and generates a magnetic field in a measurement space; and
at least two variable-current correction coils, which are variable in a value of a current, coaxial with the main coil and disposed inside the main coil, and generate a magnetic field which corrects a uniformity of the magnetic field generated by the main coil, and
a correction coil that is coaxial with the main coil and disposed outside the main coil, and generates a magnetic field that corrects the uniformity of the magnetic field generated by the main coil,
wherein the correction coil is configured to achieve, in a case that the variable-current correction coil is not energized, the sum of the second-order component generated by the main coil and a second-order component generated by the correction coil being 0.

2. The magnetic field generation apparatus according to claim 1, wherein the variable-current correction coils are different from each other in the position in the Z-axis direction.

3. The magnetic field generation apparatus according to claim 1, wherein the at least two variable-current correction coils have different widths.

4. A magnetic field generation apparatus comprising:
a main coil that is formed by winding a rare earth barium-copper-oxide (ReBCO)-based superconductive wire rod and generates a magnetic field in a measurement space;
a variable-current correction coil that is variable in a value of a current, coaxial with the main coil and disposed inside the main coil, and generates a magnetic field which corrects a second-order component of the magnetic field generated by the main coil; and
a correction coil that is coaxial with the main coil and disposed outside the main coil, and generates a magnetic field that corrects the uniformity of the magnetic field generated by the main coil,
wherein the correction coil is configured to achieve, in a case that the variable-current correction coil is not energized, the sum of the second-order component generated by the main coil and a second-order component generated by the correction coil being 0.

5. The magnetic field generation apparatus according to claim 4, wherein the variable-current correction coil is formed by winding a metallic superconductive wire rod or a bismuth-based superconductive wire rod.

6. The magnetic field generation apparatus according to claim 4, wherein the variable-current correction coil is formed by winding a ReBCO-based superconductive wire rod.

7. The magnetic field generation apparatus according to claim 4, further comprising a shim coil which is coaxial with the main coil and disposed outside the main coil, and generates a magnetic field which corrects a particular magnetic field component of the magnetic field generated by the main coil.

8. The magnetic field generation apparatus according to claim 4, wherein one of the main coil and the variable-current correction coil is operated in an energization mode in which an external power source is used and the other is operated in a permanent current mode.

9. The magnetic field generation apparatus according to claim 4, wherein the main coil and the variable-current correction coil are operated in an energization mode in which an external power source is used.

10. The magnetic field generation apparatus according to claim 4, wherein the main coil and the variable-current correction coil are operated in a permanent current mode.

11. The magnetic field generation apparatus according to claim 4, further comprising a magnetic shim which is disposed in the measurement space and increases the uniformity of the magnetic field generated by the main coil.

12. The magnetic field generation apparatus according to claim 11, further comprising a room-temperature shim coil automatic adjusting mechanism which is disposed on a side of outer circumferences of the magnetic shim and compensates for a magnetic field temporal variation due to a temperature variation of the magnetic shim.

13. The magnetic field generation apparatus according to claim 4, wherein the variable-current correction coil is energized by a power source that is different from a power source for energizing the main coil.

* * * * *